(12) United States Patent
Tran et al.

(10) Patent No.: US 6,453,916 B1
(45) Date of Patent: Sep. 24, 2002

(54) LOW ANGLE SOLVENT DISPENSE NOZZLE DESIGN FOR FRONT-SIDE EDGE BEAD REMOVAL IN PHOTOLITHOGRAPHY RESIST PROCESS

(75) Inventors: Quang Tran, San Jose, CA (US); Khoi Phan, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 125 days.

(21) Appl. No.: 09/602,443

(22) Filed: Jun. 23, 2000

Related U.S. Application Data

(60) Provisional application No. 60/210,718, filed on Jun. 9, 2000.

(51) Int. Cl.[7] .............................. B08B 3/02; B08B 13/00
(52) U.S. Cl. .................... 134/58 R; 134/113; 134/144; 134/153; 134/172; 134/902
(58) Field of Search ............................. 134/58 R, 113, 134/144, 153, 172, 902; 118/52, 56

(56) References Cited

U.S. PATENT DOCUMENTS

| | | | |
|---|---|---|---|
| 4,668,334 A | * | 5/1987 | Doornveld ................ 118/52 X |
| 5,032,217 A | * | 7/1991 | Tanaka .................... 134/902 X |
| 5,939,139 A | * | 8/1999 | Fujimoto .................. 118/52 X |
| 5,993,547 A | * | 11/1999 | Sato ....................... 134/153 X |
| 6,001,542 A |   | 12/1999 | Orth |
| 6,079,428 A | * | 6/2000 | Anai ...................... 134/902 X |
| 6,260,562 B1 | * | 7/2001 | Morinishi et al. ......... 134/902 X |

* cited by examiner

*Primary Examiner*—Philip R. Coe
(74) *Attorney, Agent, or Firm*—Amin & Turocy, LLP

(57) ABSTRACT

An edge bead removal system and method is provided that employs a nozzle for applying edge bead removal solvent to an edge bead of a photoresist material layer disposed on a wafer. The nozzle eliminates solvent splash by lowering the angle of dispense to less than 20° as well as providing more degrees of freedom to the nozzle arm adjustments. Adjustment screws and a built-in protractor provide precision in setting the application angle. The nozzle includes a clamp design having a nozzle body clamp which holds the nozzle and a main shaft with a protractor assembly for up and down angle adjustments. A support bracket is coupled to the protractor assembly and allows for pivoting and side to side movement of the protractor assembly and the support bracket with respect to one another. A clamp connects a main arm structure that moves the entire edge bead removal nozzle assembly over the wafer.

20 Claims, 12 Drawing Sheets

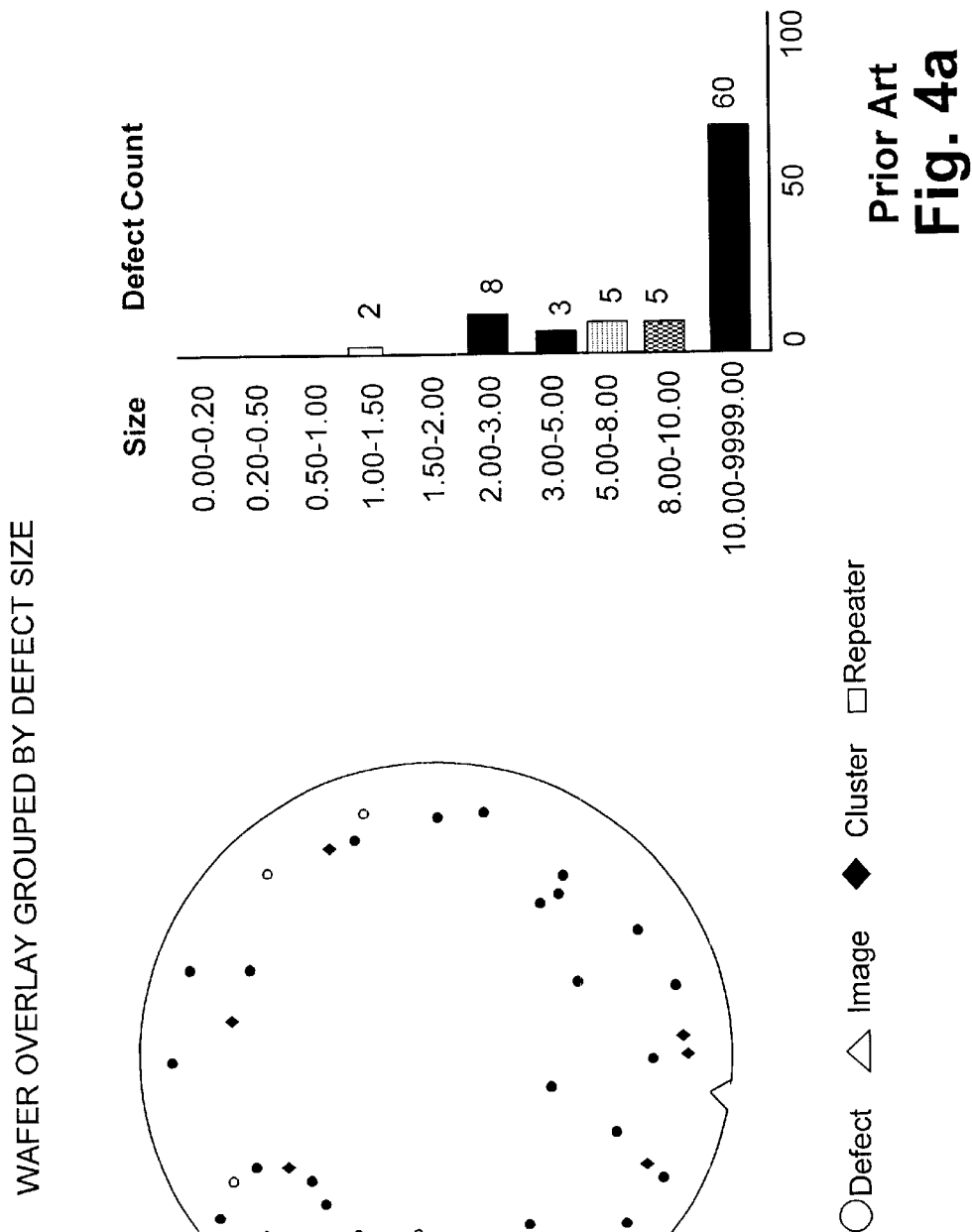

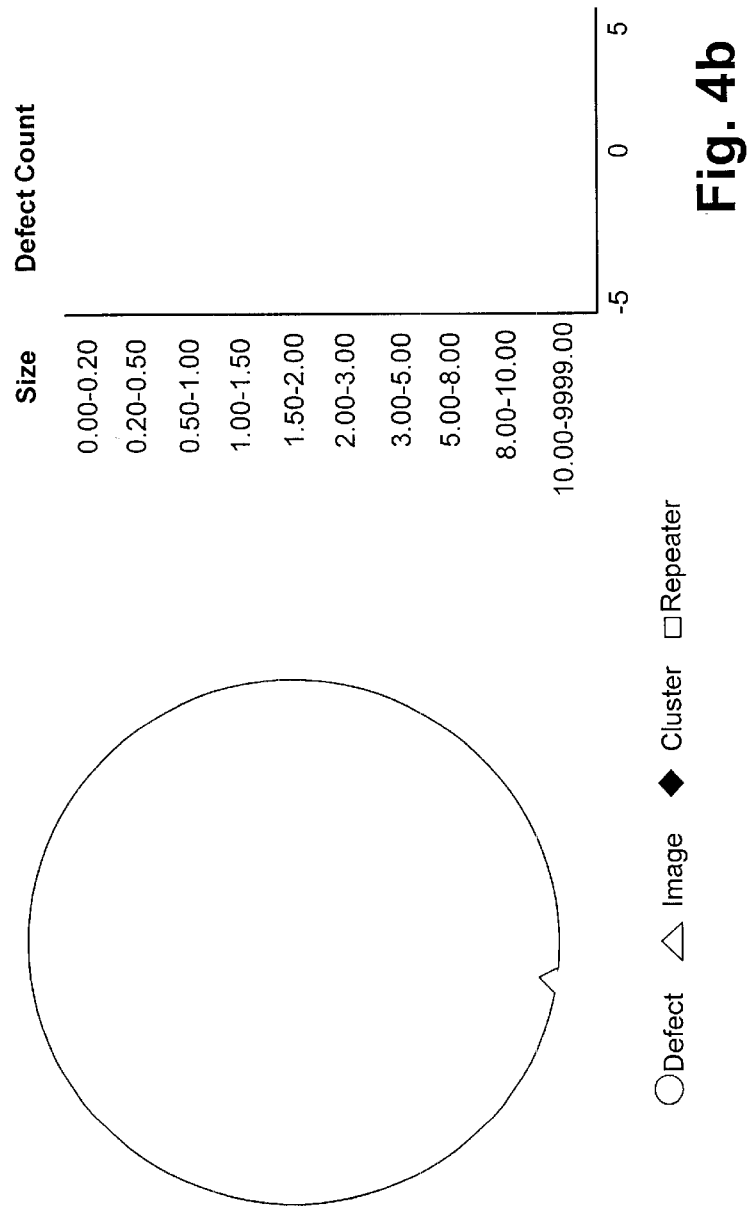

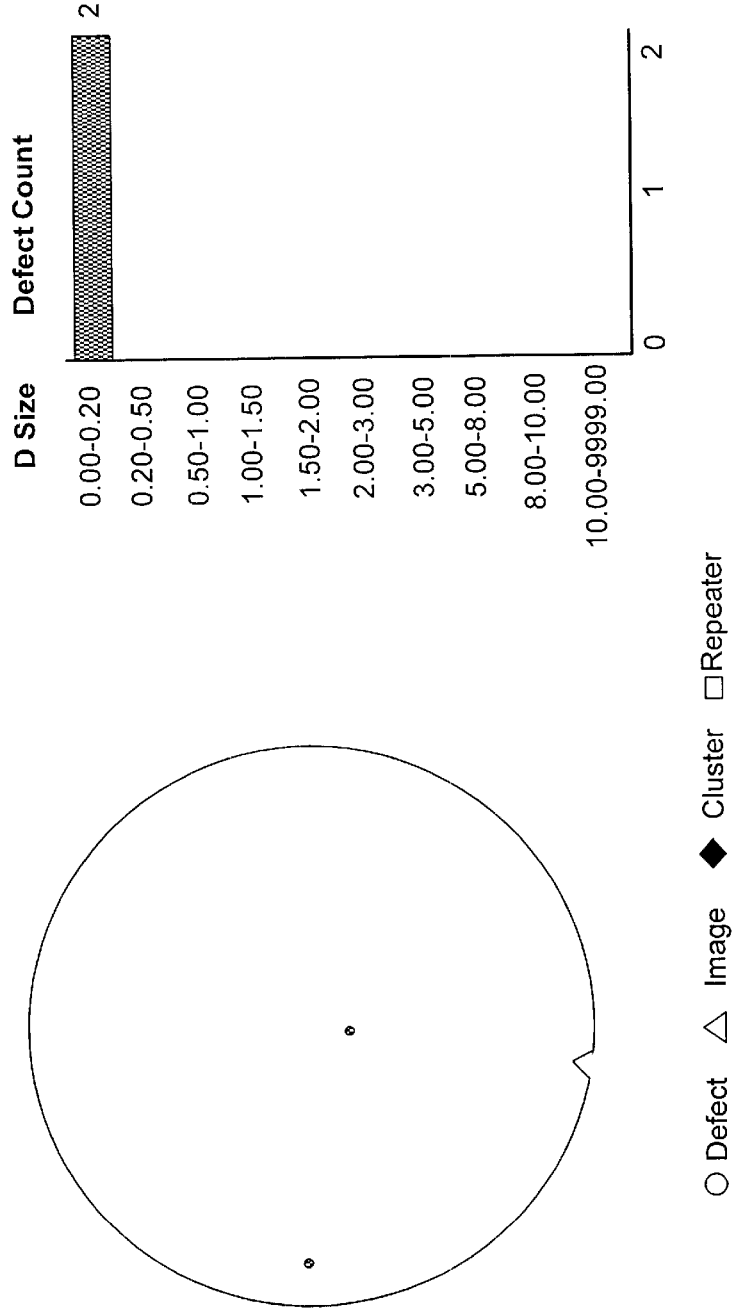

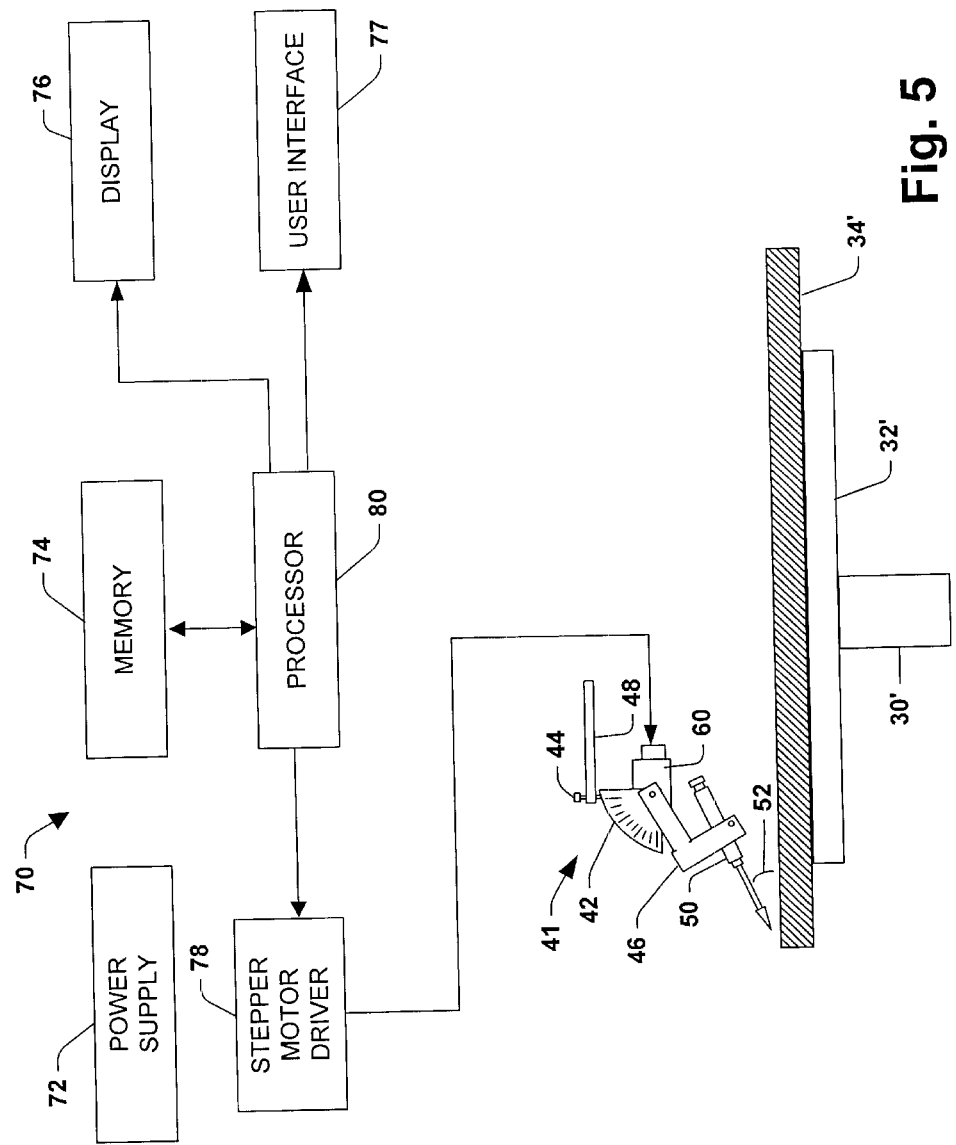

LOW ANGLE SOLVENT DISPENSE NOZZLE DESIGN FOR FRONT-SIDE EDGE BEAD REMOVAL IN PHOTOLITHOGRAPHY RESIST PROCESS

CROSS REFERENCE TO RELATED APPLICATIONS

This application claims the benefit of U.S. Provisional Patent Application Ser. No. 60/210,718, filed Jun. 9, 2000, entitled LOW ANGLE SOLVENT DISPENSE NOZZLE DESIGN FOR FRONT-SIDE EDGE BEAD REMOVAL IN PHOTOLITHOGRAPHY RESIST PROCESS.

TECHNICAL FIELD

The present invention generally relates to semiconductor processing, and in particular to a system and method for applying an edge bead removal material to the edge of a photoresist material layer disposed on a semiconductor wafer.

BACKGROUND OF THE INVENTION

In the semiconductor industry, there is a continuing trend toward higher device densities. To achieve these high densities there has been and continues to be efforts toward scaling down device dimensions (e.g., at submicron levels) on semiconductor wafers. In order to accomplish such high device packing density, smaller and smaller features sizes are required. This may include the width and spacing of interconnecting lines, spacing and diameter of contact holes, and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon structure is coated uniformly with a radiation-sensitive film, the resist, and an exposing source (such as optical light, x-rays, or an electron beam) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

Due to the extremely fine patterns which are exposed on the photoresist material, thickness uniformity of the photoresist material is a significant factor in achieving desired critical dimensions. The photoresist material should be applied such that a uniform thickness is maintained in order to ensure uniformity and quality of the photoresist material layer. The photoresist material layer thickness typically is in the range of 0.1 to 3.0 microns. Good resist thickness control is highly desired, and typically variances in thickness should be less than ±10–20 Å across the wafer. Very slight variations in the photoresist material thickness may greatly affect the end result after the photoresist material is exposed by radiation and the exposed portions removed.

Application of the resist onto the wafer is typically accomplished by using a spin coater. The spin coater is essentially a vacuum chuck rotated by a motor. The wafer is vacuum held onto the spin chuck. Typically, a nozzle supplies a predetermined amount of resist to a center area of the wafer. The wafer is then accelerated to and rotated at a certain speed, and centrifugal forces exerted on the resist cause the resist to disperse over the whole surface of the wafer. The resist thickness obtained from a spin coating process is dependent on the viscosity of the resist material, spin speed, the temperature of the resist and temperature of the wafer.

After the photoresist is spin coated onto the wafer, a rim or bead of photoresist remains on the edge of the wafer. This rim or bead is removed by applying an edge bead removal solvent by using an edge bead removal (EBR) nozzle, so that loose particles from the rim or bead do not become a source of contamination that can cause wafer defects. Typically, the solvent is either applied at the bottom edge of the wafer, while the wafer is spun causing the solvent to wick around the edge and wash off the photoresist bead or the solvent is applied on the top outside edge of the wafer. However, applying the solvent to the top edge of the wafer has its own inherent problems. One of the problems is that when the solvent spray or jet is shut off, a drop of solvent can remain in a nozzle tip of the nozzle, and may free fall onto the wafer undesirably dissolving useful portions of the photoresist material layer, thus destroying the uniformity of the wafer ultimately causing wafer defects.

Another problem is that when the solvent stream is dispensed onto the surface of wafer edge at a relative high angle (>30 degree relative to horizontal wafer plane), splashes are produced that became airbone particles. The airbone solvent particles inside the coater cup will eventually fall back onto wafer surface after resist coating causing pinholes in the resist film or localized resist film thickness variation. Consequently, following exposure with a mask and development, the resist pattern will be deformed then transferred to final etch pattern, resulting in yield loss.

FIG. 1 illustrates a typical conventional edge bead removal system 10. A wafer 34 is vacuum held onto a rotating chuck 32. The wafer 34 is spin rotated by a shaft 30 driven by a motor (not shown). A stand 12 supports a rotatable handle 14 for rotating a edge bead removal nozzle assembly 20 above the edge of the wafer 34. An L-bracket 16 is coupled to a support bracket 18, which holds a nozzle bracket 22. The nozzle bracket 22 holds the tip of an edge bead removal nozzle 26 at a fixed angle 24. Fixed angle 24 is typically above 45° and results in splashing of edge bead removal solvent splashes.

Another system for removing an edge bead on a wafer that alleviates the problem of solvent use is known as an optical edge bead removal system or track system such as the family of CLEAN TRACK® systems manufactured by Tokyo Electron Limited, Inc. in Tokyo, Japan. Such track systems are used in the various modes of photoresist processing. However, for thick resist film applications (greater than 1.5 micron), optical EBR alone is not adequate due to low power output of exposure source on the track systems and throughput constraint. The current solvent nozzle designs employed on most track equipment are not effective in reducing solvent splashes on wafer surface during edge bead removal. Solvent splashes will dissolve resist material or cause partial thickness loss leading to distorted pattern upon exposure. This type of bad pattern transfer will eventually result in IC device failure and/or yield loss. If the edge bead removal process employs back-side solvent dispense and/or optical methods only, the resist edge bead removal process will be less than optimal and residual resist will be left around wafer edges. These residual resist particles can flake off during an etch or ion implantation process causing defects on the wafer.

In view of the above, an edge bead removal nozzle is needed that ensures that droplets formed at a nozzle tip of the nozzle do not fall onto a photoresist material layer that is being worked upon.

SUMMARY OF THE INVENTION

The present invention relates to an edge bead removal system and method that employs a nozzle for applying edge bead removal solvent to an edge bead of a photoresist material layer disposed on a wafer. The edge bead removal solvent can be a developer, a rinse or a cleanser. A fine stream of solvent is dispensed from a fine, needle-like nozzle. The nozzle of the present invention eliminates solvent splash by lowering the angle of dispense to less than 20° as well as providing more degrees of freedom to the nozzle arm adjustments. The present invention employs adjustment screws and a built-in protractor to precisely set the application angle. The nozzle of the present invention includes a clamp design having a nozzle body clamp which holds the nozzle and a main shaft with a protractor assembly for up and down angle adjustments. A support bracket is coupled to the protractor assembly and allows for pivoting and side to side movement of the protractor assembly and the support bracket with respect to one another. A clamp connects a main arm structure that moves the entire edge bead removal nozzle assembly over the wafer. The nozzle assembly of the present invention is particularly useful for removing edge beads formed on photoresist material layers having a thickness equal to or greater than 1.5 microns thick.

One particular aspect of the invention relates to an edge bead removal system that includes an edge bead removal nozzle having a processor for controlling the application angle. The processor is coupled to a user interface that allows a user to set the application angle. Defect analysis can then be used to determine an optimal application angle for a given production run. The processor is also coupled to a stepper motor that rotates the nozzle to the desired application angle. A protractor component provides verification of the programmed application angle. An alternate edge bead removal system utilizes a measurement system adapted to measure defects on the wafer after edge bead removal. The measurement system is coupled to the processor and provides for automatic adjustment of the application angle.

Another aspect of the present invention relates to an edge bead removal system for applying an edge bead removal solvent on an edge bead formed on a wafer by a photoresist material application system. The system comprises an edge bead removal nozzle assembly having an adjustable application angle and an arm coupled to the edge bead removal assembly. The arm is adapted to move the nozzle assembly between a rest position and an application position.

Another aspect of the present invention relates to an edge bead removal nozzle assembly for applying an edge bead removal solvent on an edge bead formed on a wafer by a photoresist material application system. The nozzle assembly comprises an edge bead removal nozzle disposed in a nozzle bracket and a protractor component coupled to the nozzle bracket. The nozzle bracket is rotatable about a fixed point on the protractor component. The protractor component provides incremental application angle setting information based on the setting of an application angle of the nozzle with respect to a top surface of the wafer.

In yet another aspect of the invention, an edge bead removal system is provided for removing an edge bead formed on a wafer by a photoresist material application system. The system comprises means for applying an edge bead solvent on the edge bead and means for adjusting an application angle of the means for applying an edge bead solvent on the edge bead.

Another aspect of the invention relates to a method for minimizing defects in an edge bead removal process. The method comprises the steps of providing an edge bead removal nozzle assembly having an adjustable application angle and setting the edge bead removal nozzle assembly to a first application angle. The edge bead removal developer is then applied to an edge bead formed on a photoresist spin coated onto a wafer and the defects formed on the photoresist due to the edge bead removal process is determined. Based on the defect level the application angle is adjusted and the steps of applying edge bead removal developer and the step of determining the defects formed until and acceptable defect level is achieved is repeated.

Yet another aspect of the present invention relates to an edge bead removal nozzle assembly for applying an edge bead removal solvent on an edge bead formed on a wafer by a photoresist material application system. The nozzle assembly comprises an edge bead removal nozzle disposed in a nozzle bracket and a protractor component coupled to the nozzle bracket. The nozzle bracket is rotatable about a fixed point on the protractor component. The nozzle assembly also includes a support bracket coupled to the protractor component wherein the protractor component is pivotable with respect to the support bracket. Additionally, the protractor component provides incremental application angle setting information based on the setting of an application angle of the nozzle with respect to a top surface of the wafer. The application angle is adjustable between 0° and 20°.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 4a is a graph illustrating wafer defects group according to defect size using an edge bead removal system in accordance with the prior art;

FIG. 4b is a graph illustrating wafer defects group according to defect size using an edge bead removal system on a photoresist having a thickness of 1.81 microns in accordance with the present invention;

FIG. 4c is a graph illustrating wafer defects group according to defect size prior to using an edge bead removal system on a photoresist having a thickness of 1.56 microns in accordance with the present invention;

FIG. 5 is a representative schematic block diagram of an automated edge bead removal system in accordance with the present invention;

DETAILED DESCRIPTION OF THE INVENTION

Figure 1:
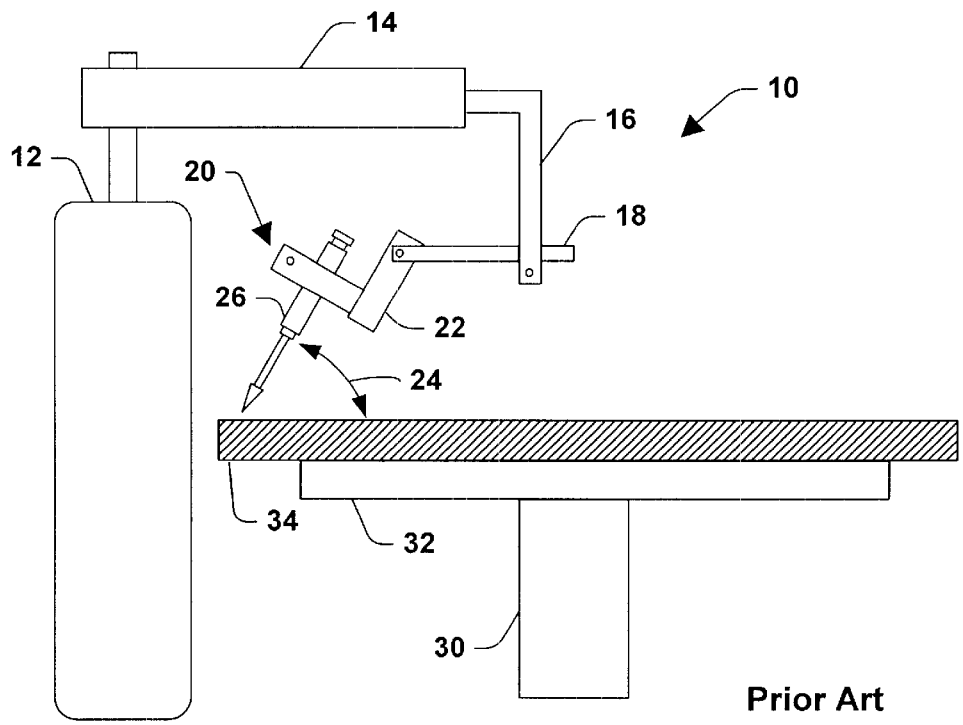
FIG. 1 illustrates a front view of an edge bead removal system in accordance with the prior art.

The present invention is now described with reference to the drawings, wherein like reference numerals are used to refer to like elements throughout. The present invention is described with reference to an edge bead removal nozzle that is rotatably adjustable for changing the angle of application of the edge bead removal solvent. It should be understood that the description of these embodiments are merely illustrative and that they should not be taken in a limiting sense.

Figure 2:
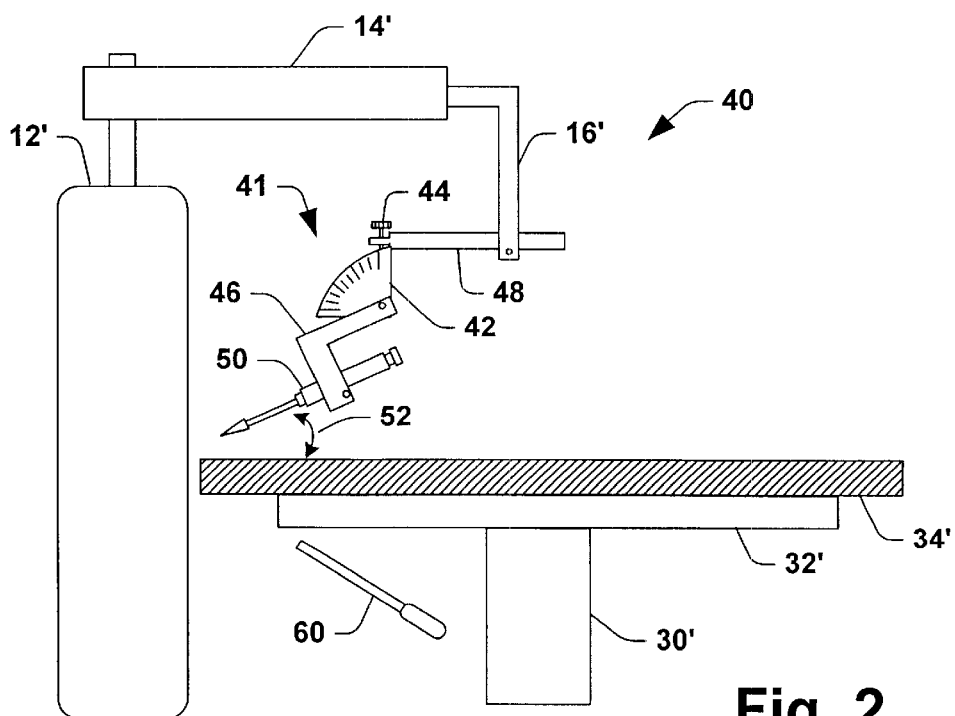
FIG. 2 illustrates a front view of an edge bead removal system in accordance with the present invention.
Figure 3A:
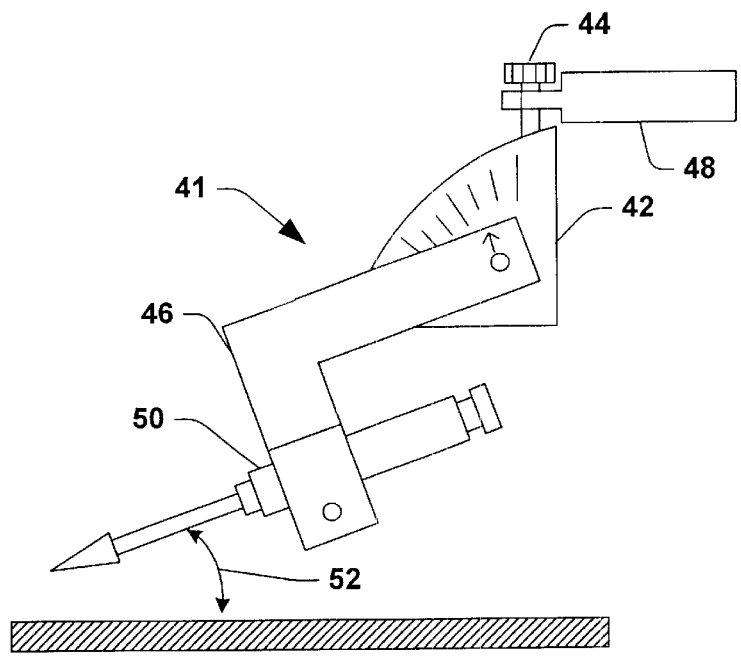
FIG. 3a illustrates a front detailed view of a nozzle assembly in accordance with the present invention.
Figure 3B:
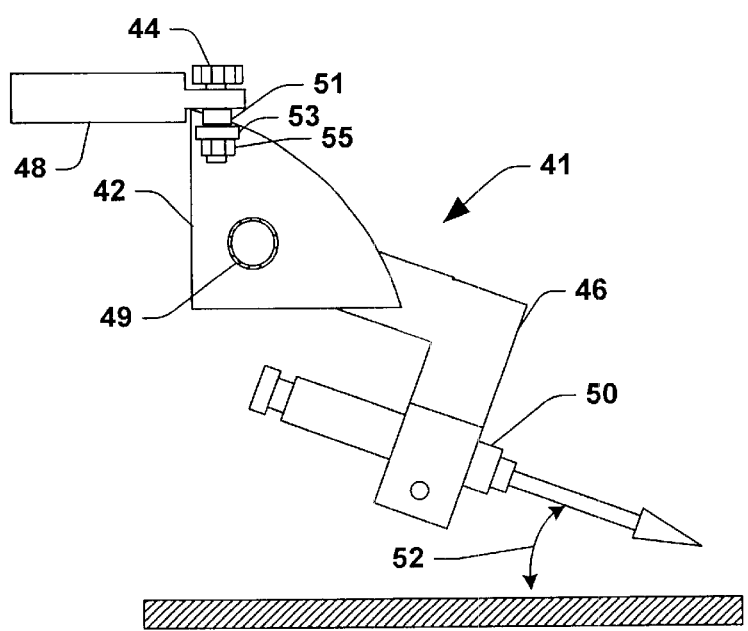
FIG. 3b illustrates a rear detailed view of the nozzle assembly of FIG. 3a in accordance with the present invention.

FIG. 2 illustrates an edge bead removal system 40 according to the present invention. A wafer 34' is vacuum held onto a rotating chuck 32'. The wafer 34' is spin rotated by a shaft 30' driven by a motor (not shown). A stand 12' supports a rotatable arm 14' for rotating an edge bead removal nozzle assembly 41 from a rest position to an application position above the edge of the wafer 34'. An L-bracket 16 is coupled to the arm 14' on one end and a support bracket 48 on the other end. The support bracket 48 is also coupled to the nozzle assembly 41. Referring to FIGS. 2 and 3a–3b, the nozzle assembly 41 includes a protractor component 42, which holds a nozzle bracket 46 and an edge bead removal nozzle 50. The nozzle bracket 46 holds the tip of the edge bead removal nozzle 50 at a solvent application angle 52. Solvent application angle 52 is preferably at or below 20° with respect to the wafer 34'. The nozzle bracket 46 is releasably rotatable about a fixed point on the protractor component 42 by loosening and tightening an adjustment or thumb screw 49. The adjustment screw 49 can be loosened and the nozzle bracket 46 rotated to any application angle 52 between 0° and 20° by aligning an arrow on the nozzle bracket 46 with an angle measurement on the protractor component 42. The adjustment screw 49 can then be set and tightened to lock in the desired application angle 52.

Figure 3C:
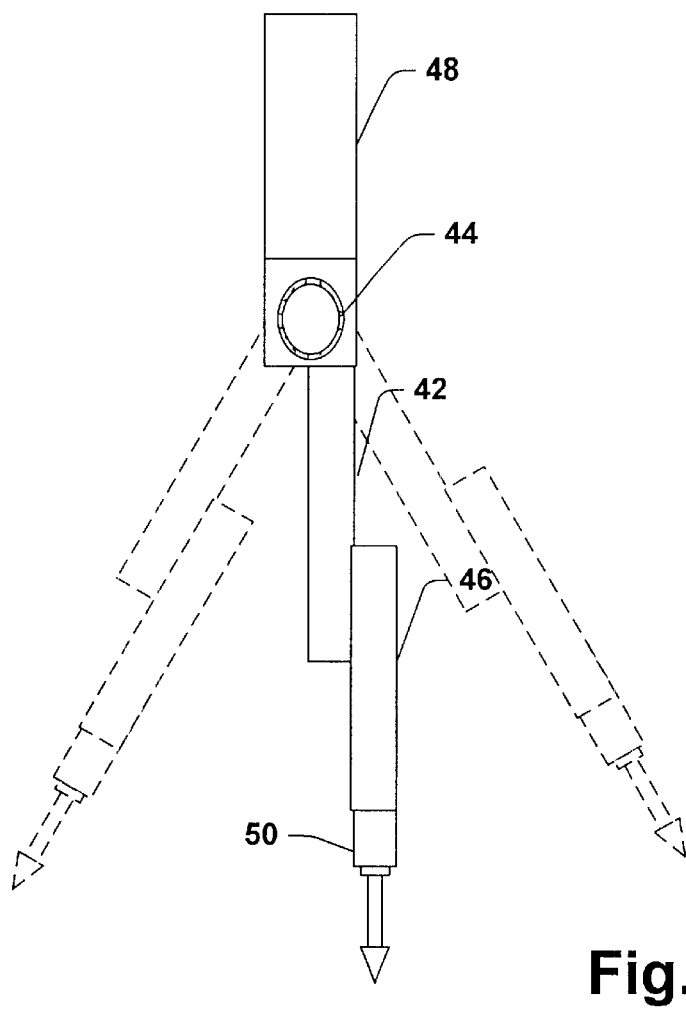
FIG. 3c illustrates a top detailed view of the nozzle assembly of FIG. 3a in accordance with the present invention.

It is to be appreciated that it is also advantageous to be able to move the edge bead removal nozzle 50 along different points around the edge of the wafer 34'. Referring to FIGS. 3a–3c, the nozzle 50 is also pivotable about an axis perpendicular to the surface of the wafer 34'. An adjustment screw 44 allows for pivotable movement of the nozzle assembly 41 along the surface of the wafer 34'. The adjustment screw 44 extends through an aperture at the end of support bracket 44, through a spacer 51 and through a circular flange 53 that extends perpendicular from a surface of the protractor component 42. A nut 55 holds the adjustment screw 44 in place. The adjustment screw 44 can be loosened and the nozzle 50 pivoted to any angle between 0° and 180° along the surface of the wafer 34'(see FIG. 3c). The adjustment screw 44 can then be set and tightened to lock in the desired surface angle. Therefore, by rotating the arm 14' and the nozzle 50 about an axis through the adjustment screw 44, the nozzle tip can be placed along any edge point on one side of the wafer. Furthermore, by allowing support bracket 48 to be rotatable about L-bracket 16', the nozzle tip can be placed along any edge point of the wafer 34'.

Figure 3D:
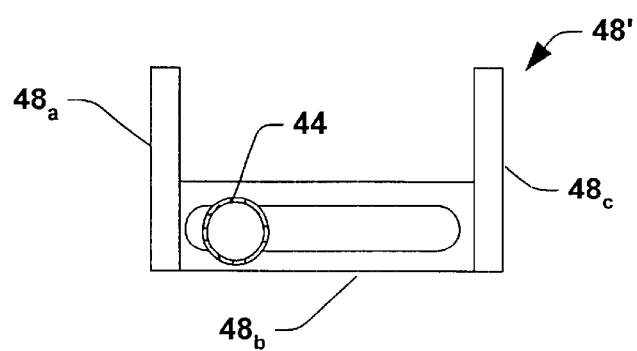
FIG. 3d illustrates a partial top view of an alternate support bracket in accordance with the present invention.

An alternate support bracket 48' is illustrated in FIG. 3d and includes a connecting member $48_b$ connecting a first bracket member $48_a$ to a second bracket member $48_c$. The connecting member $48_b$ includes a guide channel 59 that allows for both sideways movement and pivotable movement of the nozzle assembly 41. The adjustment screw 44 can be loosened and the nozzle 50 rotated to any angle between 0° and 180° along the surface of the wafer (see FIG. 3c) and also be moved sideways along wafer edge along the guide channel 59. The adjustment screw 44 can then be set and tightened to lock in the desired application position. The sideways, pivotable and rotational movement of the nozzle assembly provides for three-dimensional movement of the nozzle. It is to be appreciated that the sideways movement can be implemented by substituting flange 53 of the protractor component 42 with the connecting member $48_b$ including the guide channel 59. Furthermore, first and second bracket members $48_a$ and $48_b$ can be replaced with a first and second protractor component and support bracket 48 can be coupled to the first and second protractor component at some other location than is shown in the drawings.

Figure 4D:
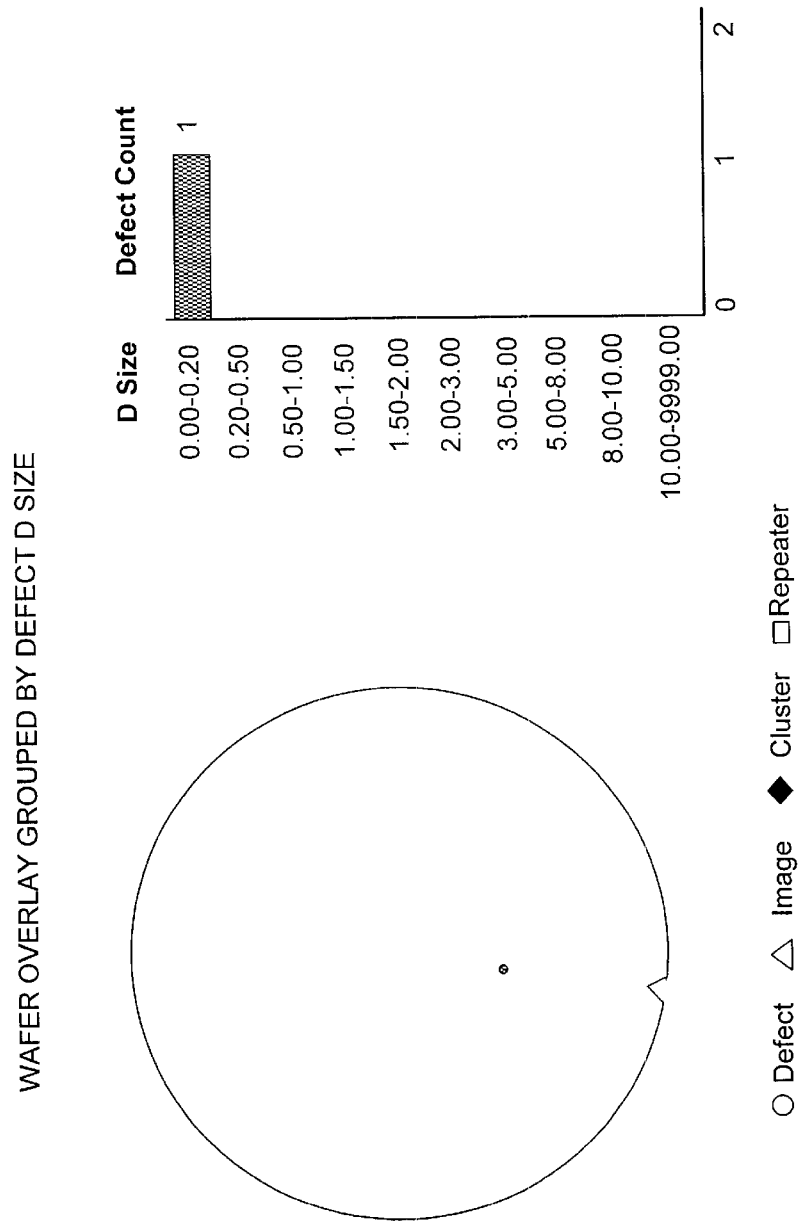
FIG. 4d is a graph illustrating wafer defects group according to defect size after using an edge bead removal system on a photoresist having a thickness of 1.56 microns in accordance with the present invention.
Figure 4E:
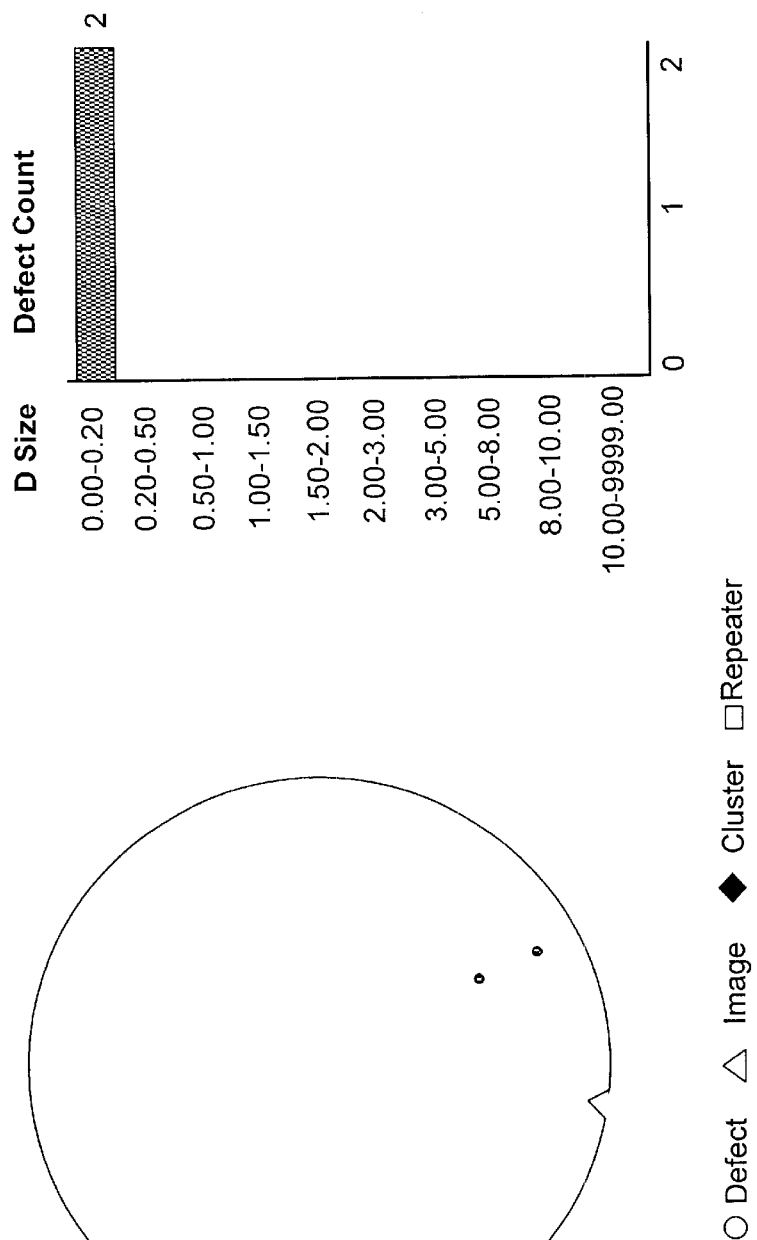
FIG. 4e is a graph illustrating wafer defects group according to defect size prior to using an edge bead removal system on a photoresist having a thickness of 1.81 microns in accordance with the present invention.
Figure 4F:
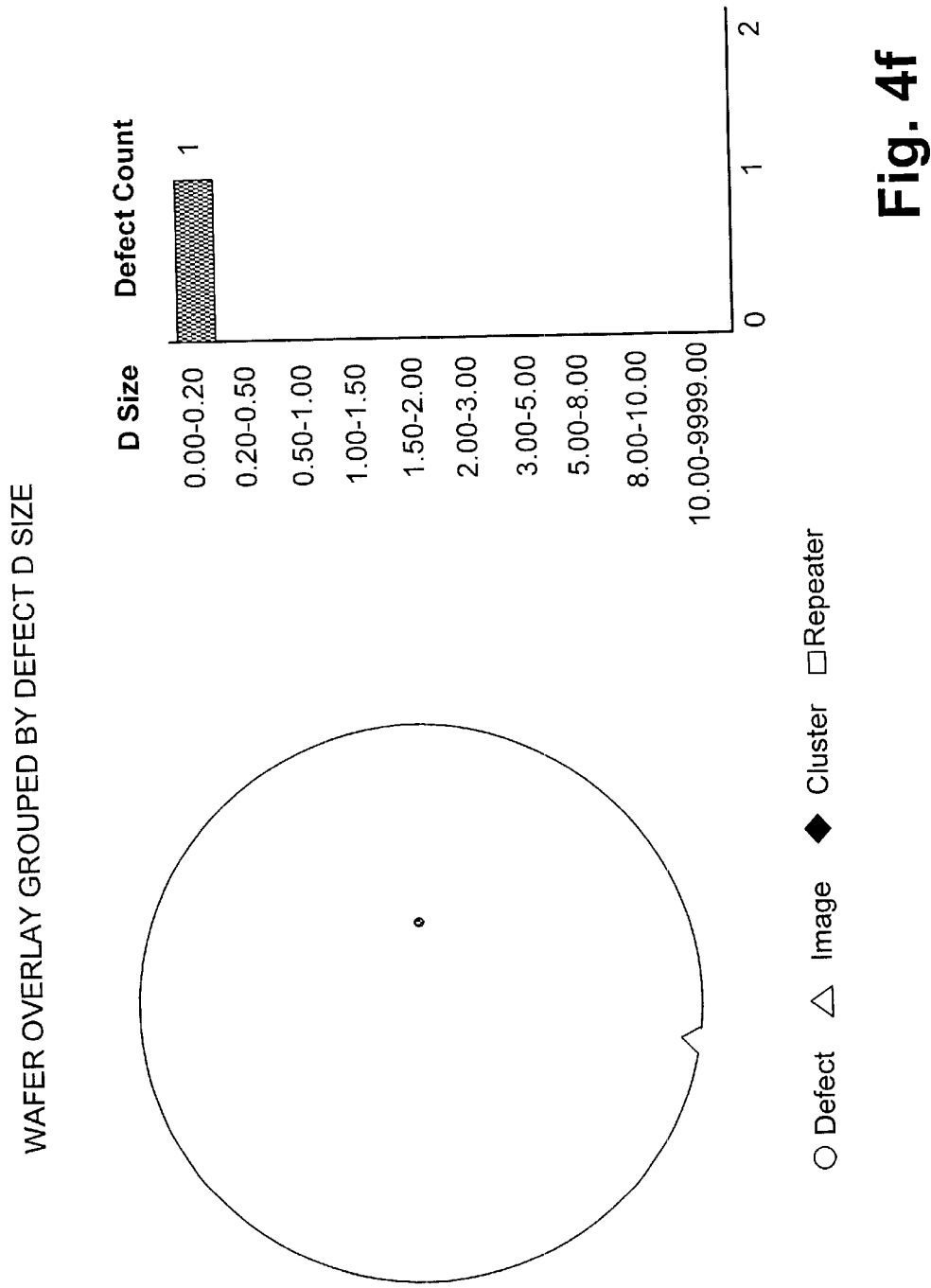
FIG. 4f is a graph illustrating wafer defects group according to defect size after using an edge bead removal system on a photoresist having a thickness of 1.81 microns in accordance with the present invention.

FIGS. 4a–4f illustrate defect counts on wafers grouped by defect size using a standard edge bead removal nozzle system and employing the system of the present invention. FIG. 4a illustrates the defect counts measured on a wafer using a conventional edge bead removal nozzle system with a resist thickness of 1.01 microns. FIG. 4b illustrates the defect counts measured on a wafer using the edge bead removal nozzle system of the present invention with a resist thickness of 1.81 microns. It can be seen from FIGS. 4a–4b that the edge bead removal system of the present invention provides much lower defect counts for much thicker resist. FIG. 4c illustrates the defect counts measured on a wafer prior to applying developer with the edge bead removal system of the present invention on a resist with a thickness of 1.56 microns. FIG. 4d illustrates the defect counts measured on a wafer after applying developer with the edge bead removal system of the present invention on a resist with a thickness of 1.56 microns. FIG. 4e illustrates the defect counts measured on a wafer prior to applying developer with the edge bead removal system of the present invention on a resist with a thickness of 1.81 microns. FIG. 4f illustrates the defect counts measured on a wafer after applying developer with the edge bead removal system of the present invention on a resist with a thickness of 1.81 microns. It can be seen from FIGS. 4c–4f that the defect count prior to edge bead removal is not much different from the defect count after edge bead removal utilizing the nozzle system of the present invention.

Referring to FIG. 5, a system 70 for automatically adjusting an edge bead removal nozzle application angle is illustrated. A photoresist material nozzle applies a photoresist material to the center of the wafer 34' that is vacuum held onto the rotating chuck 32'. The wafer 34' is spin rotated by the shaft 30' driven by a motor (not shown), so that the photoresist material forms a uniform film or layer over the wafer 24'. After the photoresist material is applied, the edge bead formed during the process needs to be removed. The edge bead removal nozzle assembly 41 is coupled to a stepper motor 60 adapted to rotate the nozzle 50 at an application angle 52 equal to or less than 20°. A stepper motor driver 78 drives the stepper motor 60 via instruction from a processor 80. The processor 80 is coupled to a user interface 77 and a display 76 that allows a user to set the application angle 52 for a given production run.

The processor 80 is programmed to control and operate the various components within the system 70 in order to carry out the various functions described herein. The processor or CPU 80 may be any of a plurality of processors, such as the AMD K7 and other similar and compatible processors. The manner in which the processor 80 can be programmed to carry out the functions relating to the present invention will be readily apparent to those having ordinary skill in the art based on the description provided herein.

A memory 74 which is operatively coupled to the processor 80 is also included in the system 70 and serves to store program code executed by the processor 80 for carrying out operating functions of the system 70 as described herein. The memory 74 includes read only memory (ROM) and random access memory (RAM). The ROM contains among other code the Basic Input-Output System (BIOS) which controls the basic hardware operations of the system 70. The RAM is the main memory into which the operating system and application programs are loaded. The memory 74 also serves as a storage medium for temporarily storing information such as application angle tables and other data which may be employed in carrying out the present invention. For mass data storage, the memory 74 may include a hard disk drive (e.g., 10 Gigabyte hard drive). Power supply 72 provides operating power to the system 70. Any suitable power supply (e.g., battery, line power) may be employed to carry out the present invention.

Figure 6:
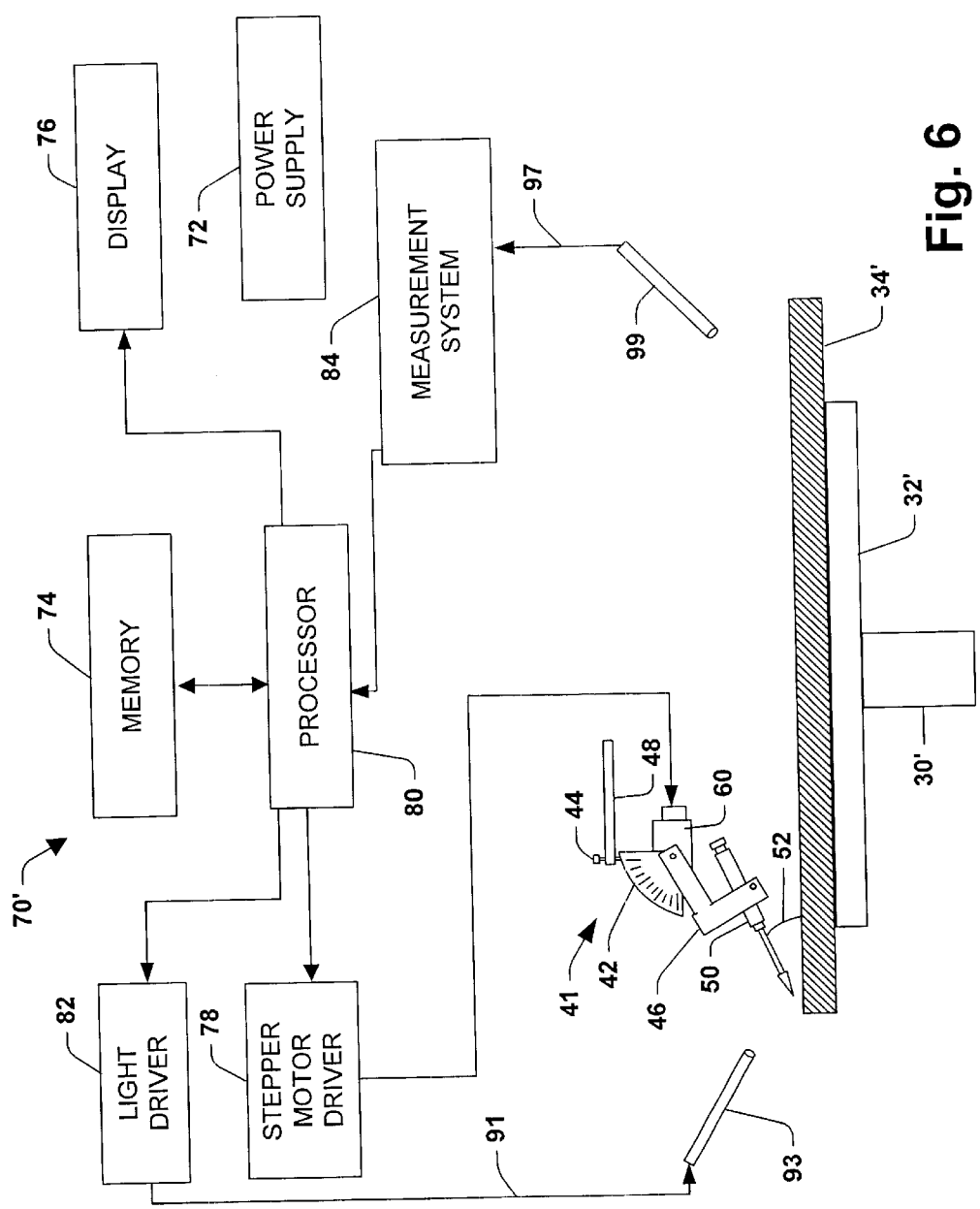
FIG. 6 is a representative schematic block diagram of a closed automated edge bead removal system in accordance with the present invention.

FIG. 6 illustrates a closed loop system 70' for controlling the edge bead removal application angle as shown were like parts are denoted by like reference numerals. The system 70' includes a particle defect measurement system 84. The system 70' includes a light source 93 connected by a fiber optic line 91 to a light driver 82. The light driver 82 is turned on and off for particle defect measurements on the photoresist material layer 34' by the processor 80, after the edge bead removal process. The light source 93 sends light at the resist layer 34', which is reflected to a light receiver 99 coupled to the measurement system 84 for making particle defect measurements. The light receiver 99 is connected to the measurement system 84 by a fiber optic line 97.

The processor 80 receives measured particle defect data from the measuring system 84 and determines the overall optimal application angle 52 based on trial and error methods, statistical methods or the like. The memory 74 which is operatively coupled to the processor 80 is also included in the system 70' and serves to store program code executed by the processor 80 for carrying out operating functions of the system 70'. Power supply 72 provides operating power to the system 70'. Any suitable power supply (e.g., battery, line power) may be employed to carry out the present invention.

Any suitable interferometry system and/or spectrometry system may be employed to carry out the present invention and such systems are intended to fall within the scope of the hereto appended claims. In one embodiment, the measurement system 84 is a polychromatic interferometer system or a monochromatic interferometer system to measure the particle defects formed on the photoresist material layer 34'. In another embodiment, the measurement system 84 is a spectrometry system. Interferometry systems and spectrometry systems are well known in the art, and therefore further discussion related thereto is omitted for sake of brevity. It is also to be appreciated that any suitable laser scattering or laser doppler anemometry system may be employed to carry out the present invention and such systems are intended to fall within the scope of the hereto appended claims. Laser scattering and laser doppler anemometry systems are well known in the art, and therefore further discussion related thereto is omitted for sake of brevity.

Figure 7:
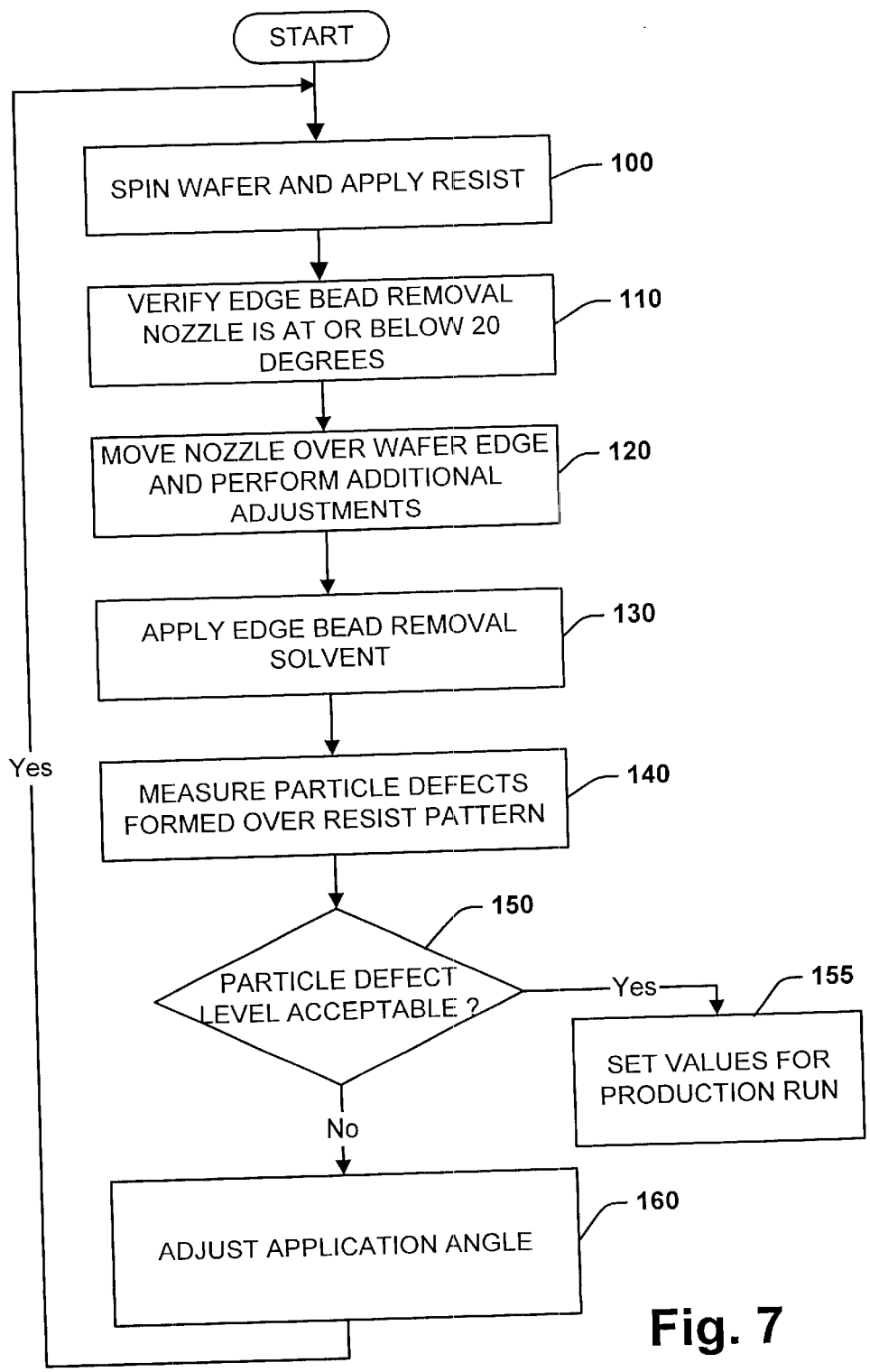
FIG. 7 is a flow diagram illustrating one specific methodology for carrying out the present invention.

FIG. 7 is a flow diagram illustrating one particular methodology for carrying out the present invention. In step 100, a test wafer is placed on a spin chuck and a photoresist material layer is spin rotated onto the wafer. In step 110, verification that the edge bead removal nozzle is at or below 20° is performed. In step 120, the nozzle 50 is moved over the wafer edge and additional adjustments are performed, such as sideways and pivotable adjustments. In step 130, edge bead removal developer is applied to the edge of the wafer via the nozzle 50. In step 140, the amount of defects on the photoresist layer is determined If the amount of defects are acceptable (Yes), the application angle is set for production in step 155. If the amount of defects are not acceptable (No), the application angle is adjusted in step 160.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An edge bead removal system for applying an edge bead removal solvent on an edge bead formed on a wafer by a photoresist material application system, the system comprising:

an edge bead removal nozzle assembly having an adjustable application angle, the edge bead removal assembly having a protractor component providing incremental application angle setting information based on the setting of the application angle; and an arm coupled to the edge bead removal assembly, the arm being adapted to move the nozzle assembly between a rest position and an application position.

2. The system of claim 1, the adjustable application angle being adjustable between 0° and 20°.

3. The system of claim 1, the edge bead removal nozzle assembly being pivotable about an axis perpendicular to a top surface of the wafer.

4. The system of claim 1, the edge bead removal nozzle assembly being movable along an axis parallel to a top surface of the wafer.

5. The system of claim 1, further including a backside nozzle adapted to apply edge bead removal developer to a bottom surface of an edge bead formed on the wafer.

6. The system of claim 1, the application angle being controlled by a processor, the processor being adapted to receive adjustment angle information from a user interface and set the application angle based on the adjustment angle information.

7. The system of claim 1, the application angle being controlled by a processor, the processor being adapted to receive defect information from a defect measurement system and provide and set the application angle based on the adjustment angle information.

8. An edge bead removal nozzle assembly for applying an edge bead removal solvent on an edge bead formed on a wafer by a photoresist material application system, the nozzle assembly comprising:

an edge bead removal nozzle disposed in a nozzle bracket;

a protractor component coupled to the nozzle bracket, the nozzle bracket being rotatable about a fixed point on the protractor component;

wherein the protractor component provides incremental application angle setting information based on the setting of an application angle of the nozzle with respect to a top surface of the wafer.

9. The nozzle assembly of claim 8, the application angle being adjustable between 0° and 20°.

10. The nozzle assembly of claim 8, further including a support bracket coupled to the protractor component wherein the protractor component is pivotable with respect to the support bracket.

11. The nozzle assembly of claim 8, further including a support bracket coupled to the protractor component wherein the protractor component and the support bracket are movable from side to side with respect to one another.

12. The nozzle assembly of claim 8, further including a support bracket coupled to the protractor component and an arm coupled to the support bracket, the arm being adapted to move the nozzle assembly between a rest position and an application position.

13. An edge bead removal-system for applying an edge bead removal solvent on an edge bead formed on a wafer by a photoresist material application system, the system comprising:

means for applying an edge bead solvent on the edge bead; and means for adjusting an application angle of the means for applying an edge bead solvent on the edge bead, the means for adjusting an application angle having a protractor component providing incremental application angle setting information based on the setting of the application angle.

14. The system of claim 13, the means for adjusting an application angle providing adjustment of the application angle between 0° and 20°.

15. The system of claim 13, further including means for pivoting the means for applying an edge bead solvent on the edge bead about an axis perpendicular to a top surface of the wafer.

16. The system of claim 13, further including means for providing sideways movement of the means for applying an edge bead solvent on the edge bead along an axis parallel to a top surface of the wafer.

17. The system of claim 13, further including means for applying an edge bead removal solvent to a backside edge of the wafer.

18. An edge bead removal nozzle assembly for applying an edge bead removal solvent on an edge bead formed on a wafer by a photoresist material application system, the nozzle assembly comprising:

an edge bead removal nozzle disposed in a nozzle bracket;

protractor component coupled to the nozzle bracket, the nozzle bracket being rotatable about a fixed point on the protractor component; and a support bracket coupled to the protractor component wherein the protractor component is pivotable with respect to the support bracket;

wherein the protractor component provides incremental application angle setting information based on the setting of an application angle of the nozzle with respect to a top surface of the wafer, the application angle being adjustable between 0° and 20°.

19. The nozzle assembly of claim 18, the protractor component and the support bracket being movable from side to side with respect to one another.

20. The nozzle assembly of claim 18, further including an arm coupled to the support bracket, the arm being adapted to move the nozzle assembly between a rest position and an application position.

* * * * *